United States Patent [19]

McGuckin et al.

[11] Patent Number: 4,979,803
[45] Date of Patent: Dec. 25, 1990

[54] COLOR FILTER ARRAY FOR AREA IMAGE SENSORS

[75] Inventors: Hugh G. McGuckin; Michael P. Cunningham, both of Rochester, N.Y.

[73] Assignee: Eastman Kodak Company, Rochester, N.Y.

[21] Appl. No.: 305,132

[22] Filed: Feb. 2, 1989

[51] Int. Cl.$^5$ .............. G02B 5/22; G02B 5/28; H04N 9/79
[52] U.S. Cl. .................. 350/317; 350/166; 358/331
[58] Field of Search .............. 350/317, 164, 166; 358/331

[56] References Cited

U.S. PATENT DOCUMENTS

| | | | |
|---|---|---|---|
| 2,769,111 | 10/1956 | Sadowsky | 350/317 |
| 3,911,479 | 10/1975 | Sakurai | 350/162.2 |
| 4,130,347 | 12/1978 | Knop | 350/162.19 |
| 4,155,627 | 5/1979 | Gale et al. | 350/162.19 |
| 4,258,126 | 3/1981 | Heisinger | 430/324 |
| 4,522,862 | 6/1985 | Bayer et al. | 428/195 |

OTHER PUBLICATIONS

Murphy, SPIE, vol. 116, *Solid State Imaging Devices*, (1977), p. 33.

Primary Examiner—Bruce Y. Arnold
Assistant Examiner—David R. Parsons
Attorney, Agent, or Firm—Raymond L. Owens

[57] ABSTRACT

A color filter array for an area image sensor comprises a plurality of color filters formed on the sensor which selectively filter different colors of light. Each color filter includes a bottom semi-transparent partially reflected silver layer, a transparent, absorption free, dielectric layer formed on the bottom layer and having a thickness selected to correspond to wavelengths of light which are to pass into the image sensor, and a top semi-transparent partially reflected silver layer formed on the dielectric layer. The arrangement is that different colors of light selectively pass through the filter array into the corresponding potential wells of the area image sensor.

4 Claims, 6 Drawing Sheets

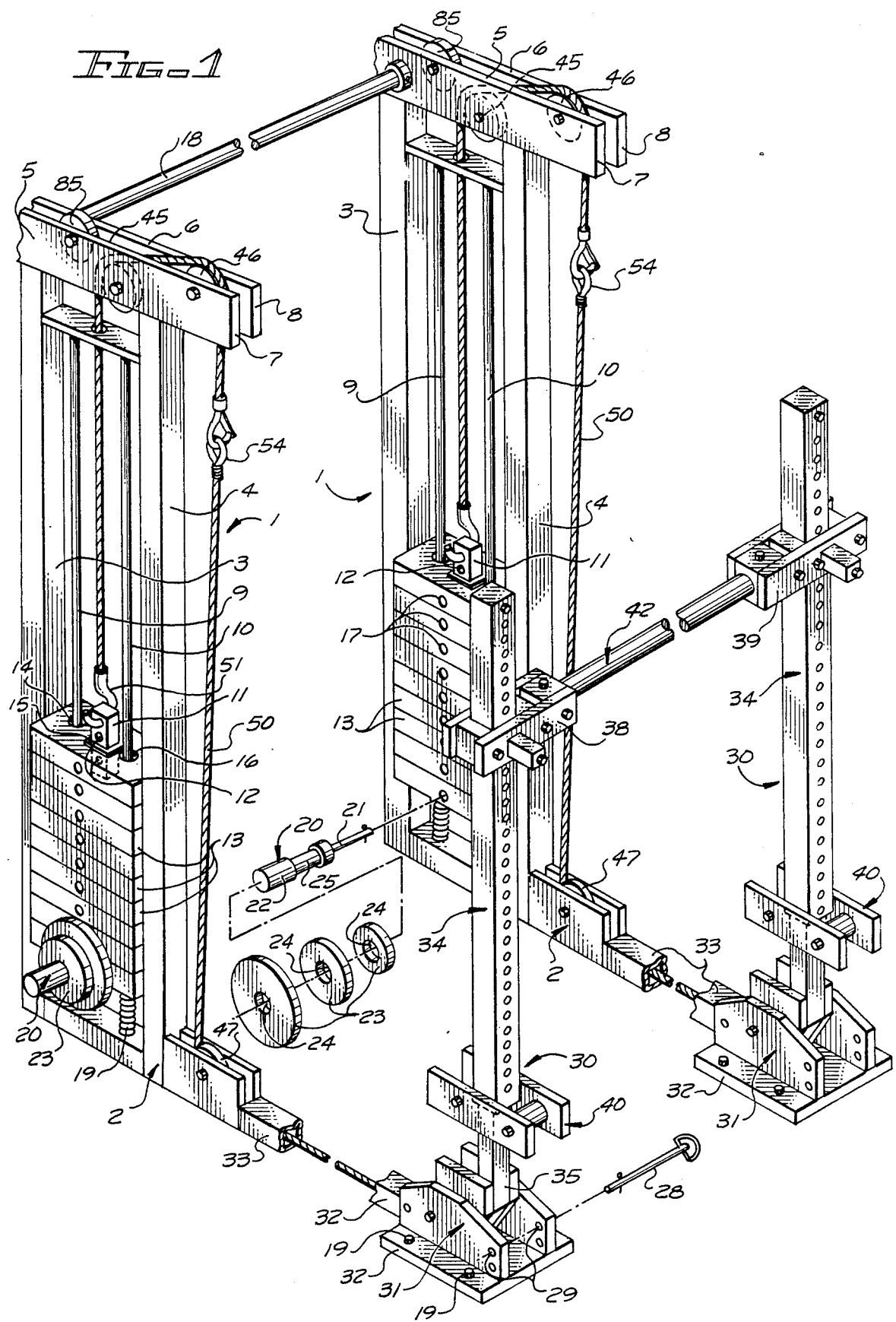

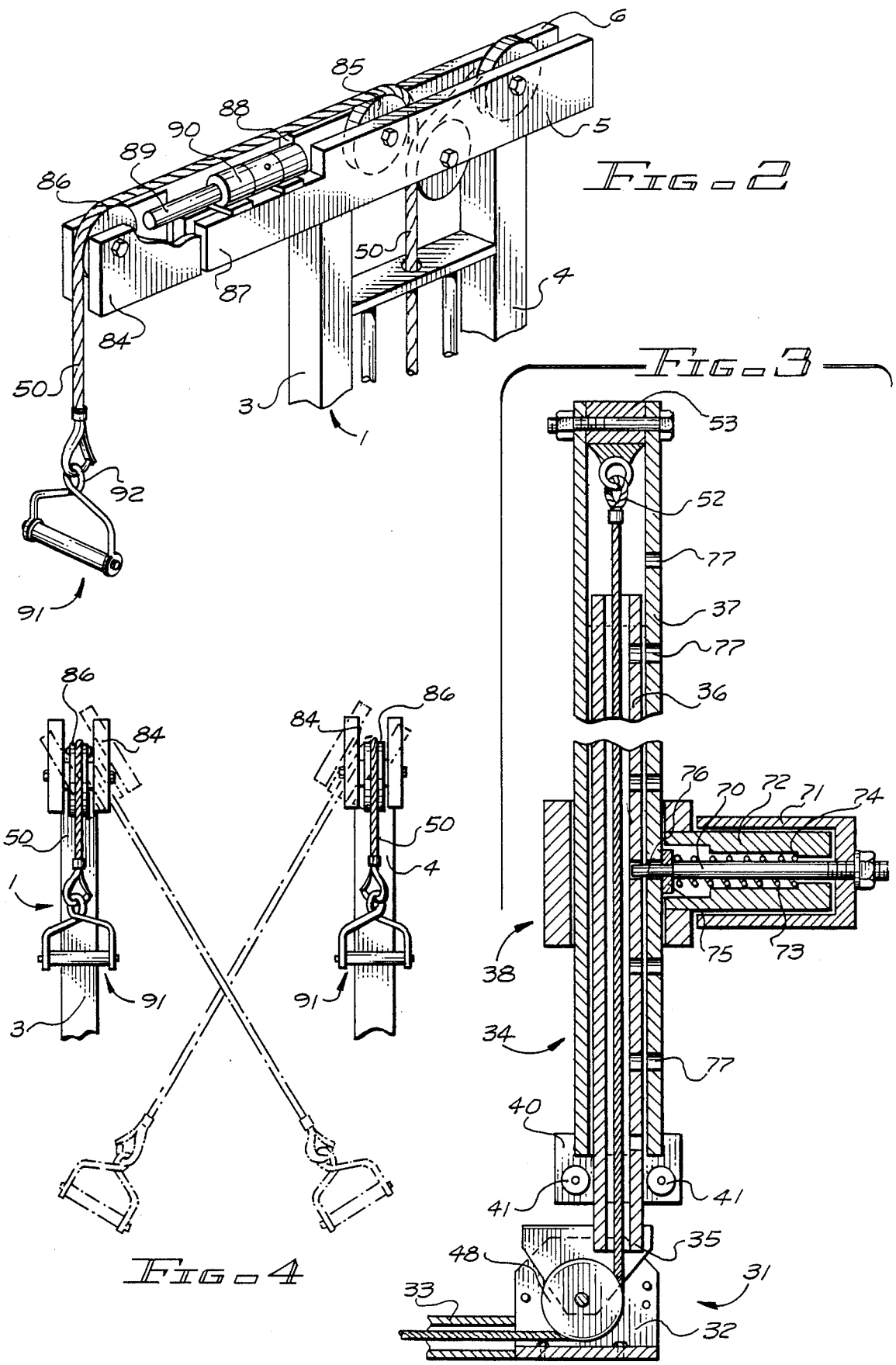

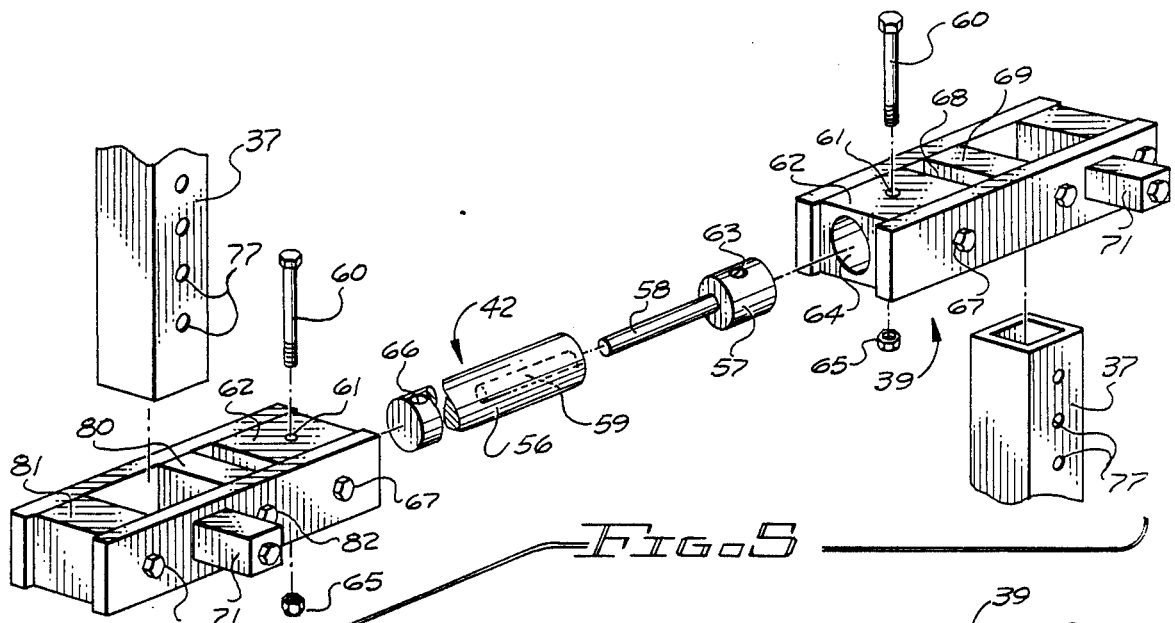
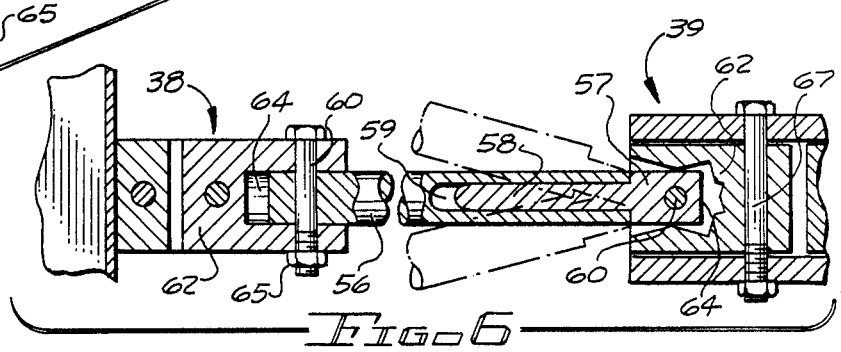
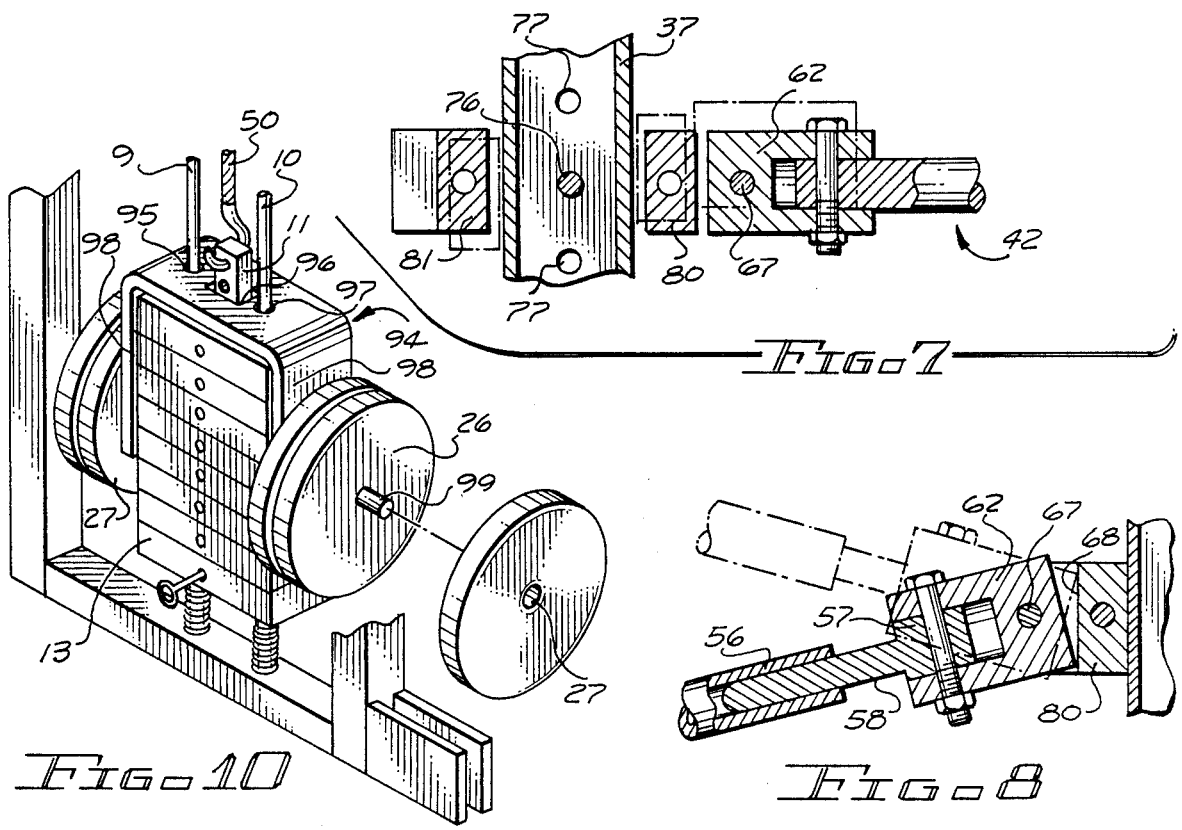
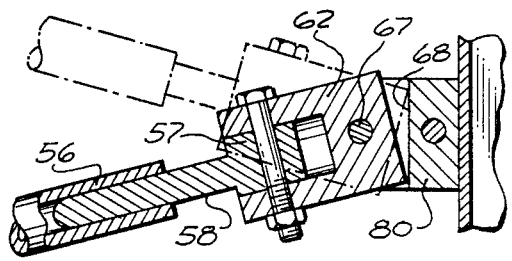

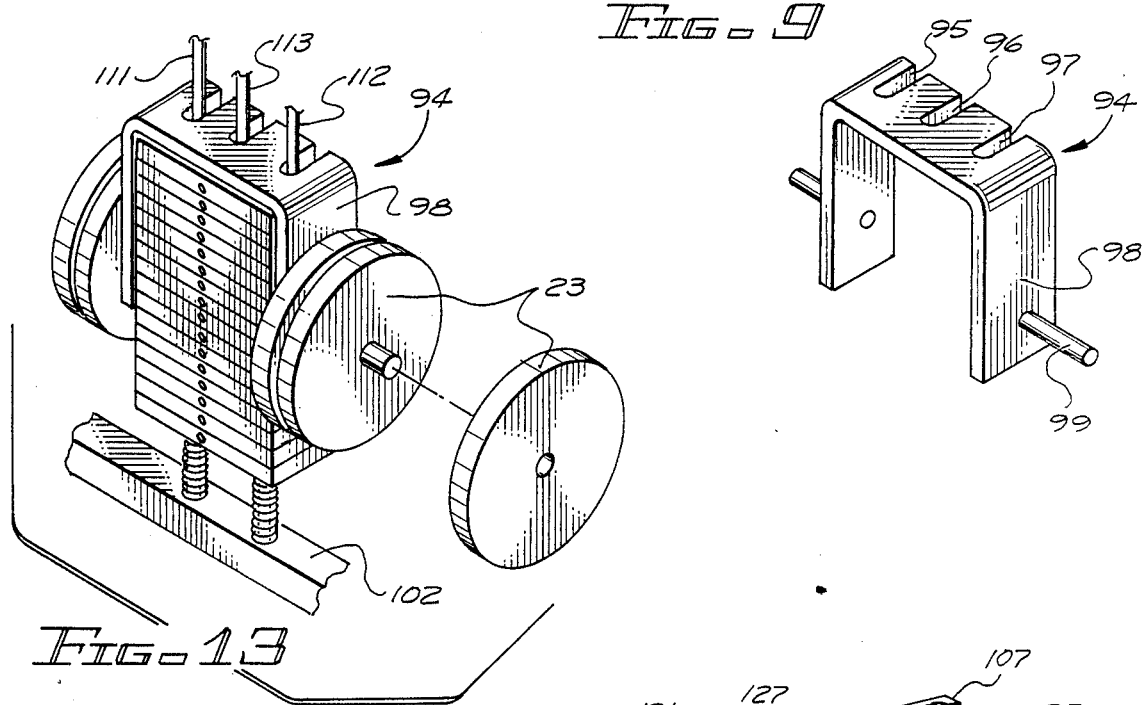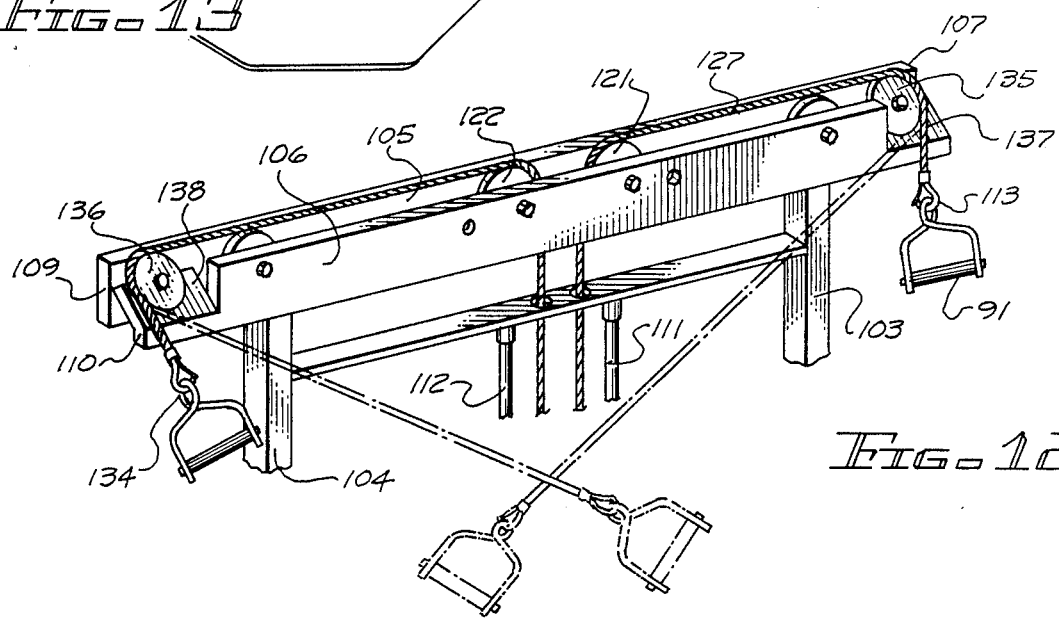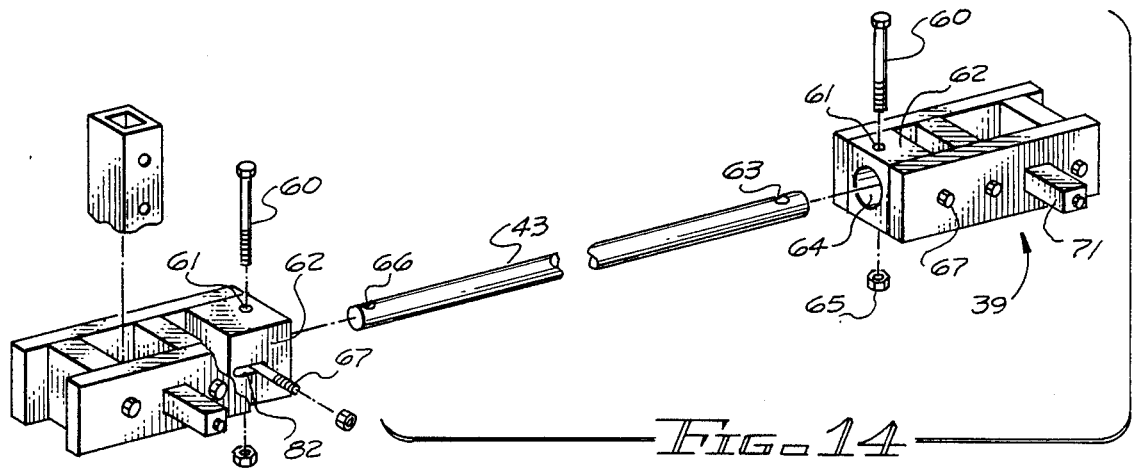

COLOR FILTER ARRAY FOR AREA IMAGE SENSORS

FIELD OF THE INVENTION

This invention relates to color filter arrays for solid state image area sensors and to methods of making such arrays.

BACKGROUND OF THE INVENTION

Color filter arrays for area image sensors, such as CCD, CID, and MOS devices for dyed filter elements are formed by coating photopatternable layers, imagewise exposing, washing off unexposed layer portions, and then dyeing the remainder filter layer by dye imbibition.

In one approach, hydrophilic colloids, for example, gelatin, can be suspended in water along with a radiation responsive hardening (i.e., cross-linking) agent to form the photopatternable composition. The hydrophilic colloid can be employed in combination with a dichromate salt employed as the radiation responsive hardening agent.

In another approach, diazo resins are the photoresponsive polymers for forming the photopatternable composition. The diazo resin can be mixed with a mordant to produce a photopatternable composition employed to form the dyed filter elements. A variety of mordants are known which are compatible with the formation of photopatternable layers by the diazo resin. These approaches are described in European Patent Application No. 249,991.

However, these and other approaches have not been entirely satisfactory for a variety of reasons. It is difficult to produce dyed filter elements having good rheological properties, speed, high resolution, sharp edge profiles, and uniform dye density. Another major problem is the fading of dyed filter elements resulting from prolonged exposure to light, heat and humidity. Also, effective green filters using dyed layers are difficult to produce.

SUMMARY OF THE INVENTION

The object of this invention is to provide a color filter array for an area image sensor which does not use dye.

In accordance with this invention, it has been determined that a color filter array can be made of transmission interference filters (Fabry-Perot type). This array is formed using an additive lift-off imaging process. Each filter consists of a vacuum deposited dielectric layer spaced between partially reflective semi-transparent silver layers.

Features and advantages of filter arrays in accordance with this invention include:

(a) the elimination of dye images which thereby avoids fading problems which can result from prolonged exposure to light, heat, or humidity;

(b) red, green, and blue filter elements can be readily produced having the desired spectral transmission characteristics;

(c) filter elements having excellent image quality (2.0 micron lines or better) can be resolved with good definition.

BRIEF DESCRIPTION OF THE DRAWINGS

The invention will be better understood from the following more detailed description taken with respect to the accompanying drawings in which:

FIGS. 1a–g illustrate the basic sequence of steps in a process for forming a pattern of a color filter array on a substrate of an image sensor in accordance with this invention. It will be appreciated that for purposes of exposition, the dimensions are not to scale the various dimensions, particularly in the vertical direction of the drawing, are quite small.

FIG. 2 shows a two-color color filter array.

FIG. 3 is a graph showing the transmission spectra for three different color filters, 94, 99, 98 made in accordance with this invention.

MODES OF CARRYING OUT THE INVENTION

Figure 11:
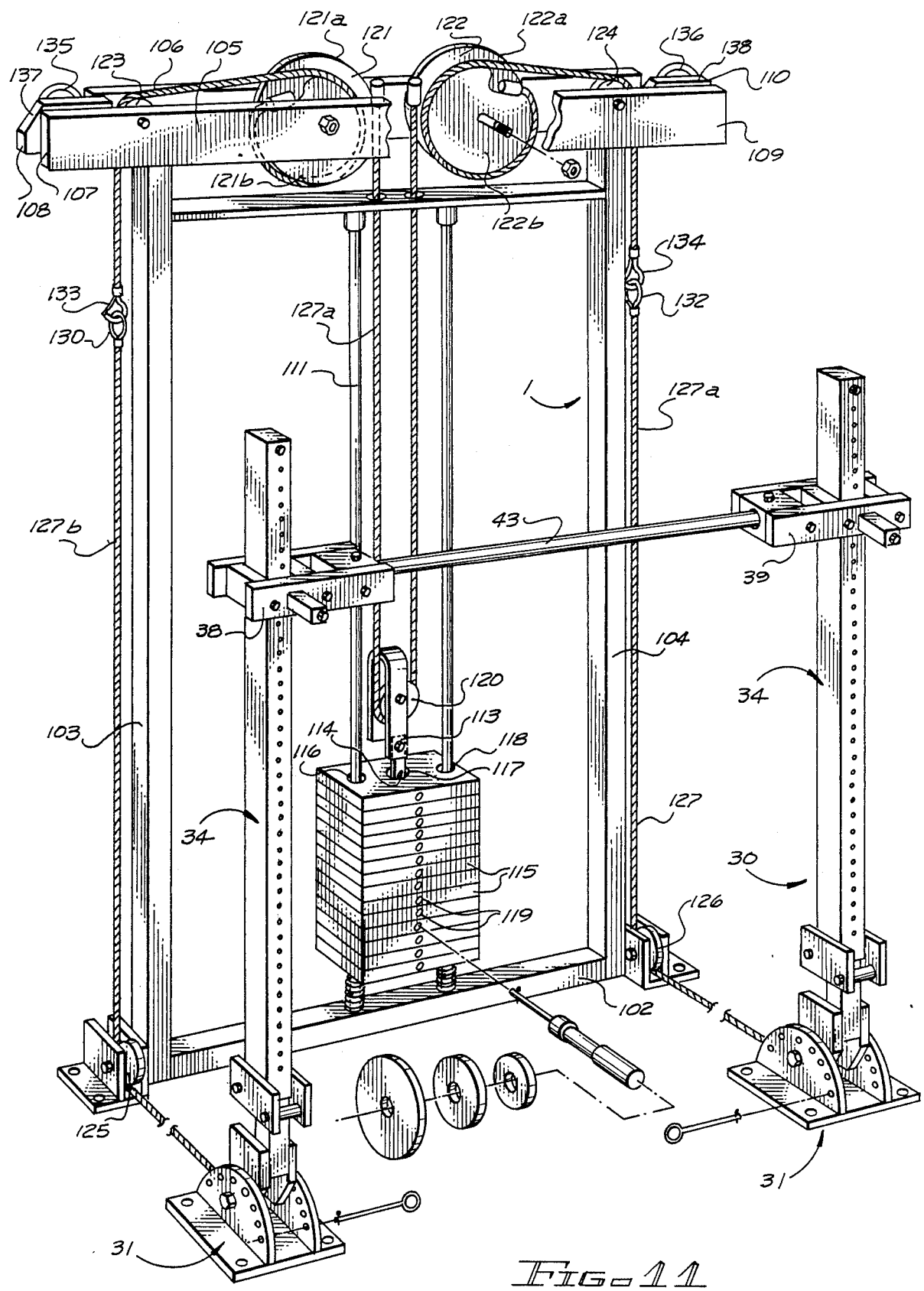
Figure 15:
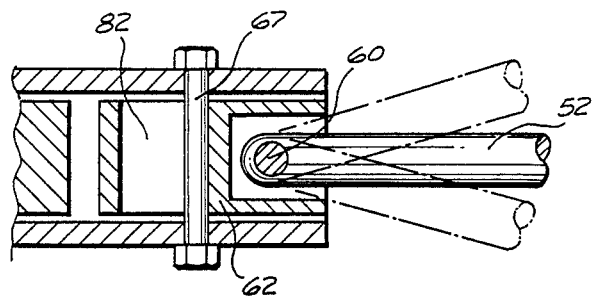
Figure 16:
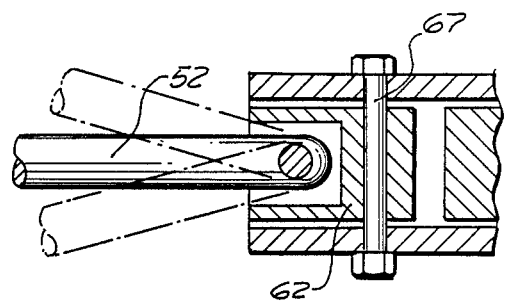
Figure 17:
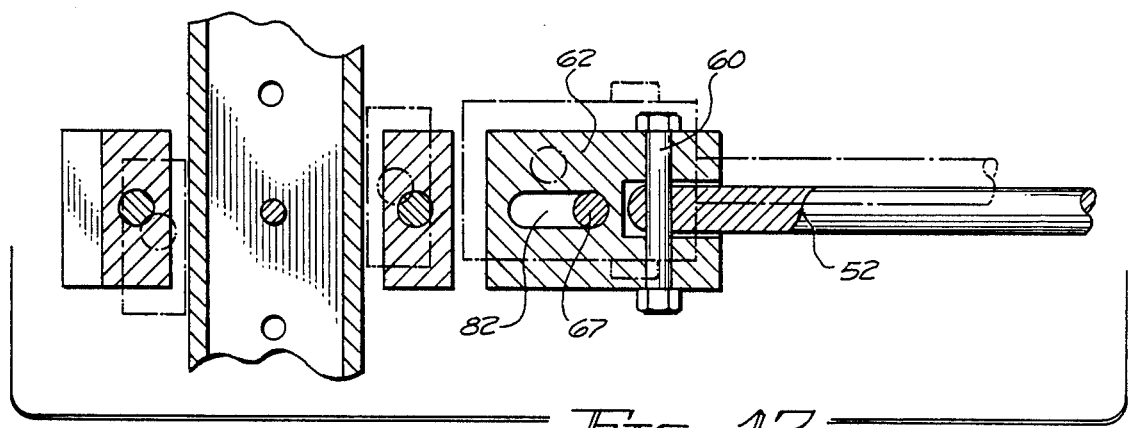
Figure 18:
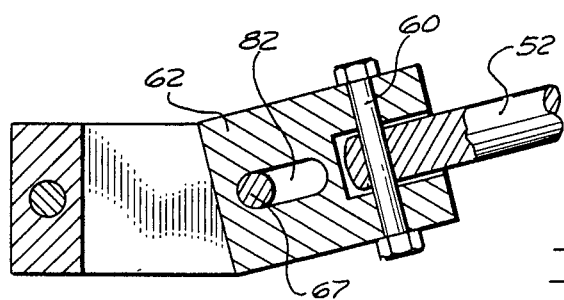

The Fabry-Perot etalon, first described in 1899, is based on interference of light passing through a spacer (typically a transparent dielectric layer) sandwiched between two semi-transparent mirrors. For a spacer having a refractive index n and thickness d (and ignoring the phase shift consequences of the metal interfaces), the etalon will transmit light of wavelength lambda at maximum intensity in accordance with:

$$\text{lambda} = \frac{2nd}{m}$$

where $m = 1, 2, 3 \ldots$

As the wavelength varies from this value, the transmitted intensity drops of rapidly and the etalon is seen to act as a color selective filter passing only light that meets the appropriate phase condition represented by m, the order of interference. Typical calculations for an etalon comprising two 20 nm silver mirrors separated by $SiO_2$ of varying thicknesses, the stack mounted between two thick pieces of glass of index 1.5, are shown below. The table presents, for the various orders, the spacer ($SiO_2$) thicknesses (d) required to transmit blue, green and red light at maximum intensity:

| order | wavelength of maximum transmitted light intensity | | |
|---|---|---|---|
| m | 450 nm | 550 nm | 650 nm |
| 1 | d = 0.9600E+02 nm | 0.1290E+03 nm | 0.1620E+03 nm |
| 2 | 0.2490E+03 | 0.3170E+03 | 0.3860E+0e |
| 3 | 0.4030E+03 | 0.5050E+03 | 0.6090E+0e |
| 4 | 0.5560E+03 | 0.6940E+03 | 0.8320E+0e |

The filter passband (and hence the filter's rejection characteristics) are controlled by m, and it will be seen that filters especially appropriate for the sensor application are formed when m=2.

The fabrication of area image sensors starts with a gettering step. As shown in FIG. 1a, a Si substrate of a conventional image sensor is designated as 10. All of the steps of making image sensors are well known. If a CCD area image sensor is to be made, well implant and dopant driving steps follow gettering. The active areas are then defined by using the localized oxidation of silicon (LOCOS) to form channel stops. A channel stop implant is done prior to field oxidation growth. A channel implant follows. After an anti-kooi oxide step, and an etch back of the anti-kooi oxide, the gate oxide layer results. Although not shown in the drawings for the sake of clarity of explanation, it will be understood by those skilled in the art that first and second levels of poly silicon gate electrodes are formed by low pressure vapor deposition methods and doped with phosphorous to provide the desired sheet resistance. Various other implants may also be formed.

Fabrication of the color filter elements will now be described. In the drawings in FIG. 1a, we see only the substrate 10, and a planarizing layer 12 which could be polymethyl methacrylate (PMMA) spin-coated on the device. A thin layer of silver 14 is vacuum deposited on the planarizing layer 12. The thickness of layer 14 is selected to be semi-tansparent and partially reflective. As shown in FIG. 1b, a uniform $SiO_2$ layer 16 is formed on the silver layer by low temperature vacuum deposition. This layer 16 is selected of a thickness to provide a blue filter.

Referring to FIG. 1c, an adhesion-promoting solution (not shown) such as HMDS is spin-coated on layer 16. A positive resist is then spin-coated, baked, exposed and developed to provide an opening 19 through resist 18 to the surface of layer 16. The added thickness of $SiO_2$ 20 needed for the green layer is then deposited and the resist image 18 and unwanted $SiO_2$ are removed by lift-off processing using acetone and ultrasonic agitation leaving the structure shown in FIG. 1d.

Referring to FIG. 1e, HMDS is spin-coated on the surfaces of the FIG. 1d structure. A positive resist 22 is spin-coated, baked, exposed and developed to provide an opening 25 through the resist 22 to the surface of layer 16 adjacent to layer 20. The added thickness of $SiO_2$ required for the red filter 24 is vacuum coated in the opening 25 (developed out region). The resist image 22 and unwanted $SiO_2$ are removed by lift-off processing using acetone and ultrasonic agitation leaving the structure shown in FIG. 1b.

In FIG. 1g, a second semi-transparent partially reflective silver layer 28 is vacuum coated. It is the same thickness as layer 14. A protective layer (PMMA) 30 is spin-coated on the silver layer 28. When illuminated with white light, red, green, and blue light passes into the substrate 10 in the positions shown in FIG. 1g.

ONE-COLOR EXPERIMENTS

In order to fine-tune the layer thicknesses to match the desired wavelengths of maximum transmission, a set of single color filters were prepared, each comprising one etalon on glass. Transmission spectra for the red, geen and blue filters prepared using spacer thicknesses corresponding to m=2 are shown in FIG. 3. The data show a good match to the desired filter wavelength and passband characteristics.

TWO-COLOR EXPERIMENT

A simple two-color experiment utilizing $SiO_2$ as the dielectric color filter material was then run. This experiment investigated the ability to coat the various layers required and to form the filter images by lift-off processing. The aim thickness for each layer eas based on a computer-generated theoretical stack for a blue and red filter. FIG. 2 shows the resulting sample in cross-section with the thickness of each layer as indicated.

The first silver mirror was vacuum deposited over a 2 in.×2 in. quartz plate. The first layer $SiO_2$ layer (representing the blue filter element) was vacuum coated oveer the silver layer. An undiluted solution of the HMDS adhesion promoter (1,1,1,3,3,3-hexamethyl disilazane) was spin-coated over the $SiO_2$ layer at 5400 rpm.

Kodak 820 Resist (undiluted) was then spin-coated at 5400 rpm over the treated $Sio_2$ layer and baked for 30 min at 90° C. This layer was contact-exposed to a chrome resolution target using an Oriel exposing device (a 200-watt mercury vapor source) and immersion processed at room temperature for 60 sec in Kodak 809 developer diluted 1:3 with Kodak 809 thinner.

After drying the resist layer, the $Sio_2$ required for the red element was vacuum coated on the sample.

The resist image and the $SiO_2$ coated over the resist image were cleanly removed by immersion of the sample (coated side up) in acetone for two minutes at room temperature using an ultrasonic cleaning device to provide the necessary agitation.

The resulting $SiO_2$ images were vacuum coated with a second silver mirror (same thickness as the first) and then vacuum coated with a protective layer of $SiO_2$ (200 nm thickness).

Image quality appeared to be excellent. Photomicrographs by both reflection (Normarski DIC) and transmission brightfield showed resolution of 3.0 μm lines or better with good definition. The single-layer image transmitted blue light. The two-layer image transmitted a blue-red color (peaks at 400 and 600 nm) as expected for that thickness.

We claim:

1. A color filter array formed on a silicon substrate of an image sensor, comprising:
    a plurality of color filters associated with the image sensor for selectivity filtering different colors of light including:
        (i) a bottom semi-transparent partially reflective layer formed on the silicon substrate;
        (ii) a transparent absorption free dielectric layer formed on the bottom layer and having a thickness selected so that a particular range of wavelengths of light corresponding to a particular color passes into the image sensor;
        (iii) a top semi-transparent partially reflective layer;
    with the thickness of such dielectric layers being selected to correspond to the colors of the filters.

2. The invention as set forth in claim 1 when the dielectric layer is $SiO_2$ and the bottom and top layers are silver.

3. A method of forming a color filter array on a silicon substrate of an image sensor, comprising:
    (a) coating a bottom layer of a reflective semi-transparent metal material on the silicon substrate of the image sensor;
    (b) forming three different thicknesses of $SiO_2$ with each different thickness corresponding to a particular color of a particular filter; and
    (c) coating a top reflective semi-transparent metal layer on the three different layers of $SiO_2$.

4. A method of forming a color filter array on a silicon substrate of an image sensor, comprising:
    (a) coating a bottom reflective, semi-transparent silver layer on the silicon substrate of the image sensor;
    (b) forming three contiguous layers of $SiO_2$ with each layer having a different thickness, the thickest layer being selected to permit red light to pass into the image sensor, the next thickest layer (the middle thickness layer) being selected to permit green light to pass into the image sensor, and the thinnest layer being selected to permit blue light to pass into the image sensor; and
    (c) coating a top silver layer on three different layers of $SiO_2$.

* * * * *